(12) United States Patent
Van Helvoort

(10) Patent No.: US 9,594,132 B2
(45) Date of Patent: Mar. 14, 2017

(54) REDUCTION OF PEAK ELECTRICAL POWER CONSUMPTION IN MAGNETIC RESONANCE IMAGING SYSTEMS

(75) Inventor: Marinus Johannes Adrianus Maria Van Helvoort, Leende (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 565 days.

(21) Appl. No.: 14/006,127

(22) PCT Filed: Mar. 23, 2012

(86) PCT No.: PCT/IB2012/051392
§ 371 (c)(1),
(2), (4) Date: Sep. 19, 2013

(87) PCT Pub. No.: WO2012/127450
PCT Pub. Date: Sep. 27, 2012

(65) Prior Publication Data
US 2014/0009151 A1      Jan. 9, 2014

(30) Foreign Application Priority Data
Mar. 24, 2011 (EP) .................................... 11159498

(51) Int. Cl.
*G01V 3/00* (2006.01)
*G01R 33/34* (2006.01)
*G01R 33/385* (2006.01)

(52) U.S. Cl.
CPC ... *G01R 33/34023* (2013.01); *G01R 33/3856* (2013.01)

(58) Field of Classification Search
CPC .................................................. G01R 33/3856
USPC .................................. 324/315, 314, 318, 322
See application file for complete search history.

(56) References Cited

U.S. PATENT DOCUMENTS

| 4,788,834 A | 12/1988 | Usui |
| 6,229,311 B1 | 5/2001 | Abenaim |
| 6,879,852 B1 | 4/2005 | Mueller |
| 6,977,501 B2 * | 12/2005 | Kassai ............... G01R 33/3856 324/315 |

(Continued)

FOREIGN PATENT DOCUMENTS

| EP | 0562791 A | 9/1993 |
| EP | 2184615 A1 | 5/2010 |

(Continued)

*Primary Examiner* — Louis Arana

(57) ABSTRACT

A magnetic resonance imaging system (402, 500) includes magnetic field gradient coils (516), a gradient coil power supply (320, 424, 518), a processor (540), and a chiller (308, 526) for providing the coolant to the gradient coils. The magnetic resonance imaging system further includes a memory (546) for storing machine executable instructions (580, 582, 584, 586, 588, 590, 592). The instructions cause the processor to receive (100, 200) a pulse sequence (550), to generate (102, 202) the chiller control signals using the pulse sequence and a chiller thermal model (582) of the gradient coils and the coolant reservoir, and to send (104, 206) the chiller control signals to the chiller. The chiller control signals cause the chiller to halt chilling at least a portion of the time when the gradient coil power supply supplies current to the magnetic field gradient coils.

15 Claims, 4 Drawing Sheets

(56) References Cited

U.S. PATENT DOCUMENTS

| | | | | |
|---|---|---|---|---|
| 8,188,741 B2* | 5/2012 | Sakakura | ............... | H01F 6/04 |
| | | | | 324/318 |
| 8,305,079 B2* | 11/2012 | Iwasa | ............... | G01R 33/3804 |
| | | | | 324/315 |
| 8,643,370 B2* | 2/2014 | Kimmlingen | ...... | G01R 33/3856 |
| | | | | 324/318 |
| 8,797,032 B2* | 8/2014 | Ookawa | ............... | A61B 5/055 |
| | | | | 324/314 |
| 2001/0019266 A1 | 9/2001 | Nerreter | | |
| 2002/0156595 A1 | 10/2002 | Hedlund | | |
| 2004/0017195 A1 | 1/2004 | Kassai | | |
| 2009/0193816 A1 | 8/2009 | Clayton | | |
| 2010/0085053 A1* | 4/2010 | Iwasa | ............... | G01R 33/3804 |
| | | | | 324/318 |

FOREIGN PATENT DOCUMENTS

| | | | |
|---|---|---|---|
| JP | 08322815 | A | 10/1996 |
| JP | 10225446 | A | 8/1998 |
| JP | 11099135 | A | 4/1999 |
| JP | 2002159465 | A | 6/2002 |

* cited by examiner

REDUCTION OF PEAK ELECTRICAL POWER CONSUMPTION IN MAGNETIC RESONANCE IMAGING SYSTEMS

CROSS-REFERENCE TO PRIOR APPLICATIONS

This application is the U.S. National Phase application under 35 U.S.C. §371 of International Application No. PCT/IB2012/051392, filed on Mar. 23, 2012, which claims the benefit of European Patent Application No. 11159498.2, filed on Mar. 24, 2011. These applications are hereby incorporated by reference herein.

TECHNICAL FIELD

The invention relates to magnetic resonance imaging, in particular to power management in magnetic resonance imaging systems.

BACKGROUND OF THE INVENTION

In Magnetic Resonance Imaging (MRI), gradient amplifiers and their associated magnetic field gradient coils are typically used to provide 3-dimensional spatial encoding of atomic spins located in a magnetic field.

These gradient amplifiers are typically characterized by high peak power (several 100 kVA up to 2 MVA for present-day specimens) and high precision of the generated current waveforms. Circuits consisting of series-connected half or full bridges using pulse-width modulation (PWM) have been used to construct gradient amplifiers.

The Japanese patent application JP-08 322815 mentions the problem of improving cooling efficiency of gradient coils and to avoid unnecessary power consumption. This Japanese patent application discloses a magnetic resonance system that is provided with means to cool the gradient coil. It has means to predict the temperature and a means to start cooling when the gradient coil reaches a predetermined temperature.

SUMMARY OF THE INVENTION

Currently for emerging markets there is a commercial driver to keep the power rating of an MR Scanner low without lowering performance. This is because many underdeveloped countries lack the electrical infrastructure to provide enough peak electrical power to install magnetic resonance imaging systems. There are two problems with reducing peak electrical power consumption by magnetic resonance imaging systems:
1) The large difference between standby, average and peak power consumption;
2) The large inrush currents.

Embodiments of the invention may address the first problem using several modifications to the operation of the magnetic resonance imaging system. Magnetic resonance imaging systems typically use chillers to cool the gradient coils during operation. In some embodiments of the invention the peak electrical power consumption is performed by turning off the compressor of the chiller. The compressor in the chiller can be turned off, when there is a buffer vessel or coolant reservoir present. Assuming a 6 degree minimum and a 15 degree maximum temperature with a buffer vessel of 100 liter (which would be more or less standard), the compressor can be turned off for 2.5 minutes. It is however easy to increase the buffer size. The turn off time increases linearly with the buffer volume.

Some embodiments of the invention may also address the first problem by controlling a cryo-cooler. Superconducting magnets for magnetic resonance imaging use a cryo-cooler or cryo-compressor to cool the superconducting coils. The cryo-compressor also can be turned off for several minutes, because the cryostat has a large thermal capacity.

When the scan has finished the system has to cool down again. The cost-performance point can be chosen by design. If a large duty cycle is required, a compressor with a high cooling capacity can be installed. This does not impact the total system power rating, because that is still dominated by the amplifiers.

The second is solved in some embodiments by merging the power supplies from both amplifiers in to a common power supply with power factor correction and to combine their large capacitors banks. The complete system then is powered via this power supply. The capacitor banks not only deliver the peak power for the amplifiers, but also compensate the inrush currents for the compressors. The inverters and additional storage capacitors required for running the pumps and compressors and the control methodology will become cheaper over time, because their price will be driven by the renewable energy market.

A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. References to a computer-readable storage medium should be interpreted as possibly being multiple computer-readable storage mediums. Various executable components of a program or programs may be stored in different locations. The computer-readable storage medium may for instance be multiple computer-readable storage medium within the same computer system. The computer-readable storage medium may also be computer-readable storage medium distributed amongst multiple computer systems or computing devices.

'Computer memory' or 'memory' is an example of a computer-readable storage medium. Computer memory is any memory which is directly accessible to a processor. Examples of computer memory include, but are not limited to: RAM memory, registers, and register files. References to 'computer memory' or 'memory' should be interpreted as possibly being multiple memories. The memory may for instance be multiple memories within the same computer system. the memory may also be multiple memories distributed amongst multiple computer systems or computing devices.

'Computer storage' or 'storage' is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa. References to 'computer storage' or 'storage' should be interpreted as possibly being multiple storage. The storage may for instance be multiple storage devices within the same computer system or computing device. The storage may also be multiple storages distributed amongst multiple computer systems or computing devices.

A 'computing device' as used herein encompasses to any device comprising a processor. A 'processor' as used herein encompasses an electronic component which is able to execute a program or machine executable instruction. References to "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses a interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

Magnetic Resonance (MR) data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic resonance imaging system comprising a set of magnetic field gradient coils. Typically magnetic field gradient coils contain three separate sets of coils for spatially encoding in three orthogonal spatial directions. A magnetic field gradient power supply or gradient amplifier supplies current to the magnetic field gradient coils. The current supplied to the magnetic field coils is controlled as a function of time and may be ramped or pulsed.

The magnetic resonance imaging system further comprises a gradient coil power supply for supplying the set of magnetic field gradient coils with electrical current. The magnetic resonance imaging system further comprises a chiller for chilling a coolant in a coolant reservoir. The chiller is adapted for providing the coolant at least to the set of magnetic field gradient coils. In other words the chiller may be adapted or constructed such that it can provide the coolant for cooling the set of magnetic field gradient coils. The coolant may indirectly cool the gradient coils. For instance the coolant may be used to cool a secondary circuit which is operated at a higher temperature to prevent condensation on or around the gradient coils. For the same reason a secondary circuit is typically used when the coolant is used to cool other components such as the gradient coil power supply and the radio-frequency transmitter. The coolant reservoir is a reservoir containing a quantity of the coolant. The magnetic resonance imaging system further comprises a processor for controlling the magnetic resonance imaging system. The processor may comprise dedicated hardware as well as software modules. Notably the processor controls the chiller. The processor can have various control functions to control various aspects of the magnetic resonance examination system. For example, the processor may include a separate hardware or software module to control the chiller. The chiller is adapted for receiving chiller control signals from the processor. The chiller control signals may contain commands which allow the processor to control the operation and function of the chiller. For instance the chiller may contain a compressor system which causes the chiller to chill the coolant in the coolant reservoir. The cooled coolant is then transported from the coolant reservoir to the magnetic field gradient coils. Then heat from the gradient coil (e.g. from the electrically resistive coil conductors) is directly or indirectly transferred to the coolant. The chiller control signals may for instance comprise commands which cause the compressor of the chiller to turn on or turn off, independently of the temperature of the magnetic field gradient coils. In this way less cooling power is required, also when compared to the cooling power needed in the magnetic resonance system known from Japanese patent application JP-08 322815 An insight of the present invention is that the coolant acts as a buffer for continue cooling of the magnetic field gradient coils, even when the coolant is not actively cooled when electrical current is applied to the magnetic field gradient coils. Alternatively the chiller control signals may also set the temperature to which the coolant is chilled. The magnetic resonance imaging system further comprises a memory for storing machine executable instructions.

Execution of the instructions causes the processor to receive a pulse sequence. A pulse sequence as used herein encompasses a plan or set of instructions which detail the operation of the magnetic resonance imaging such that it acquires magnetic resonance data. The pulse sequence may in some embodiments be in the form of a graph which is presentable to a human operator and which can be interpreted by a human. In other instances the pulse sequence may be in the form of machine readable instructions. In both cases the pulse sequence may be interpreted by the processor and used to generate commands for controlling the operation of the magnetic resonance imaging system such that it acquires magnetic resonance data. Execution of the instructions further cause the processor to generate the chiller control signals using the pulse sequence and a chiller thermal model of the gradient coils and the coolant reservoir. In this embodiment, the processor is provided with an analysis module which derives from the pulse sequence which gradient pulses are included in the pulse sequence and employ the thermal model to estimate the temperature of the magnetic field gradient coils during operation of the pulse sequence. The analysis module on the basis of the estimated temperature then derives the chiller control signals so as to reduce the temperature of the magnetic field gradient coils before the pulse sequence is applied. The chiller control signals cause the chiller to halt chilling the coolant at least a portion of the time when the gradient coil power supply supplies current to the set of magnetic field gradient coils. Because the magnetic field gradient coil is cooled in advance, it is avoided that the temperature of the magnetic field gradient coils exceeds a pre-set safety threshold.

Execution of the machine executable instructions further cause the processor to send the chiller control signals to the chiller. Sending the chiller control signals to the chiller may cause the chiller to execute the chiller control signals. Notably, the chiller control signals suppress or switch off operation of the chiller during (part of) the period during which power is supplied to the magnetic field gradient coils. The chiller control signals are generated using the pulse sequence and the chiller thermal model such that the chilling of the coolant can be halted when the magnetic field gradient coils are being supplied current by the gradient coil power supply. This is beneficial because both the chiller and the gradient coil power supply use large amounts of electrical power. By turning the chiller off for at least a period of time when the gradient coil power supply is functioning this may have the benefit of reducing the peak electrical power consumed by the magnetic resonance imaging system. In contrast to current magnetic resonance imaging systems the time at which the chiller is shut off is planned in advance by using the pulse sequence. This provides for a magnetic resonance imaging system which has a reduced peak electrical power consumption.

In some embodiments there may be temperature sensors in the coolant reservoir, within the magnetic field gradient coils, and/or temperature sensors which measure the temperature of coolant entering and/or exiting the set of magnetic field gradient coils. This data may be received by the processor and used as an input in the pulse sequence.

In some embodiments the chiller may also provide coolant to additional systems and not just only the set of magnetic field gradient coils. In some embodiments, the chiller comprises the coolant reservoir.

In another embodiment the chiller control signals are adapted to reduce the peak electrical power consumption by the magnetic resonance imaging system. As was mentioned previously the pulse sequence may be used in conjunction with the chiller thermal model to plan when the chiller halts the chilling of the coolant. The coolant reservoir essentially provides for a thermal reservoir which may be used to chill the set of magnetic field gradient coils when the chilling of the coolant is halted.

In another embodiment the magnetic resonance imaging system further comprises a thermal reservoir temperature monitor. The thermal reservoir temperature monitor may for instance be a temperature sensor. Execution of the instructions further causes the processor to monitor the reservoir temperature using the reservoir temperature monitor. Execution of the instructions further cause the processor to modify the chiller control signals if the reservoir temperature is above a predetermined threshold. Execution of the instructions further cause the processor to send the modified chiller control signals to the chiller. Although the pulse sequence is used to plan when the halting of the chilling of the coolant is performed, there may be some instances where the coolant warms more rapidly than the thermal model predicts. For example there may be a failure in one of the systems of the magnetic resonance imaging system such as the set of magnetic field gradient coils may be damaged or the ambient temperature may be higher than expected. Monitoring the reservoir temperature provides for an additional degree of safety in operating the system. This embodiment may have the advantage of providing for a more robust method of reducing the peak electrical power consumption.

In another embodiment the magnetic resonance imaging system further comprises a cryogenically cooled magnet. The magnetic resonance imaging system further comprises a cryo-cooler for cooling the cryogenically cooled magnet. The cryo-cooler comprises a cryo-compressor. The cryo-cooler is adapted for receiving cryo-cooler control signals from the processor. Execution of the instructions further cause the processor to generate the cryo-cooler control signals using the pulse sequence and the cryogenic system thermal model for thermally modeling the cryo-cooler and the cryogenically cooled magnet. The cryo-cooler control signals cause the cryo-compressor to halt at least a portion of the time when the gradient coil power supply supplies current to the set of magnetic field gradient coils. Execution of the instructions further causes the processor to send the cryo-cooler control signals to the cryo-cooler.

This embodiment of the invention may also have the benefit of reducing the peak electrical power consumption by the magnetic resonance imaging system. The gradient coil power supply uses enormous amounts of electrical power consumption for brief periods of time. Switching the cryo-cooler off during at least a portion of this time may have the benefit of reducing the peak electrical power consumption. As with the previous embodiment the cryo-cooler is switched off in a planned manner using the pulse sequence and a cryogenic system thermal model. Without the pre-planning it is possible the cryo-cooler would be on at the same time as the gradient coil power supply supplies current to the set of magnetic field gradient coils. In addition large inrush currents caused by both the cryo-cooler and the chiller being switched on simultaneously may be prevented.

This embodiment may also have the benefit of generating the cryo-cooler control signals and the cooler control signals together using the pulse sequence and their respective thermal models. This may be extremely beneficial because it may not be possible to switch the chiller or the cryo-cooler off for the entire duration of time that the set of gradient coils are energized. However, it may be much easier to reduce the peak power consumption by switching the cryo-cooler and/or the chiller off. For instance the chiller may be running while the cryo-cooler is turned off and the cryo-cooler may be turned on in some instances when the chiller is turned off. This enables a more flexible means of reducing the peak electrical power consumption by the magnetic resonance imaging system.

In another embodiment the cryo-cooler control signals are adapted to reduce the peak electrical power consumption by the magnetic resonance imaging system. This embodiment may have the benefit of reducing the peak electrical power consumption.

In another embodiment the cryo-cooler comprises a cold head for providing heat transfer between the cryogenically cooled magnet and the cryo-cooler. A cold head as used herein encompasses a surface of a cryo-cooler exposed to a cryogenic system which provides heat transfer and allows the cryo-cooler to cool the cryogenic system. The cold head may also comprise a mass which may act as a thermal reservoir. The magnetic resonance imaging system further comprises a cold head temperature monitor. For instance a cold head temperature monitor may be a temperature sensor. Execution of the instructions causes the processor to monitor the cold head temperature using the cold head temperature monitor. This may comprise receiving temperature data from the cold head temperature monitor. Execution of the instructions further cause the processor to modify the cryo-cooler control signals if the cold head temperature is above a predetermined threshold. Execution of the instructions further cause the processor to send the modified cryo-cooler control signals to the cryo-cooler. This embodiment may be beneficial because the cryo-cooler control signals were generated in a pre-planned manner using the pulse sequence and the cryogenic system thermal model. Monitoring the cold head temperature may enable more efficient operation of the magnetic resonance imaging system and may provide for means of preventing a failure by an error in the generation of the cryo-cooler control signals and/or a failure in a portion of the cryogenically cooled magnet.

In another embodiment the cryo-cooler control signals and the chiller control signals are generated in accordance with one another in order to reduce the peak electrical power consumption by the magnetic resonance imaging system. Both the cryo-cooler and the chiller may be operated such that for brief periods of time they have reduced power consumption.

In another embodiment the magnetic resonance imaging system further comprises a radio-frequency transmitter. The radio-frequency transmitter is adapted for being powered by a direct current electrical power. This may in itself be beneficial because many radio-frequency transmitters convert alternating current electrical power into direct current electrical power. The magnetic resonance imaging system further comprises a capacitor bank for providing direct current electrical power to both the radio-frequency transmitter and the gradient coil power supply. This embodiment is extremely beneficial because normally a capacitor bank is used to provide power to the gradient coil power supply. In this instance both the radio-frequency transmitter and the gradient coil power supply are powered by the same capacitor bank. The capacitor bank may be charged during times when the electrical power consumption of the magnetic resonance imaging system is reduced. This embodiment allows operation of both the radio-frequency transmitter and the gradient coil power supply in such a fashion that the peak electrical power consumption by the magnetic resonance imaging system may be reduced.

In another embodiment the capacitor bank comprises an electrical power storage element for storing electrical power. For instance the electrical power storage element may comprise super capacitors and/or batteries. This embodiment may have the advantage of making the magnetic resonance imaging system more robust for mains power interruptions.

In another embodiment the radio-frequency transmitter is adapted for being powered by a variable voltage direct current electrical power source. The capacitor bank is adapted for providing a variable voltage direct current electrical power to both the gradient coil power supply and the radio-frequency transmitter. This may be beneficial because the capacitor bank may be used to help control the voltage supplied to the set of gradient coils. For instance the capacitors may be connected in a series fashion to increase voltage. Having a radio-frequency transmitter that is able to take a variety of voltages as a power supply simplifies the requirements on the capacitor bank.

In another embodiment the capacitor bank comprises at least a first capacitor bank and a second capacitor bank. Essentially the capacitor bank has been divided into at least two parts. The capacitor bank is adapted for supplying direct current electrical power to the radio-frequency transmitter using one of the first capacitor bank and the second capacitor bank. By using just one of the sub-capacitor banks the radio-frequency transmitter is supplied with the voltage of the particular sub-capacitor bank. The capacitor bank is adapted for supplying direct current electrical power to the gradient coil power supply using both the first capacitor bank and the second capacitor bank. If there are additional capacitor banks the capacitor bank may be adapted for supplying direct electrical current with those additional capacitor banks. For instance the capacitor bank connected to the radio-frequency transmitter would supply DC current at a particular voltage and then the first capacitor bank and the second capacitor bank could be used to supply voltage to the gradient coil power supply of a different voltage. For instance the first and second capacitor banks could be connected in series. This embodiment is advantageous because it allows the supplying of a variable voltage to the gradient coil power supply while at the same time providing a near steady DC voltage to the radio-frequency transmitter.

In another embodiment the capacitor bank is adapted for receiving charging commands from the processor. Execution of the instructions causes the processor to generate charging commands. The charging commands are adapted for reduce the peak electrical power consumption of the magnetic resonance imaging system. Execution of the instructions further cause the processor to send the charging commands to the capacitor bank. This is beneficial because the pulse sequence may be used to pre-plan the charging commands. This may be used to charge the capacitors at a time when the electrical power consumption of the magnetic resonance imaging system is reduced. In some embodiments the charging commands may be generated and planned at the same time that the chiller control signals and/or the cryo-cooler control signals are generated. This may provide for a magnetic resonance imaging system with a greatly reduced electrical power consumption.

In another embodiment the chiller is adapted for providing the coolant at least to the radio-frequency transmitter. The chiller thermal model is adapted for thermally modeling the radio-frequency transmitter. In this embodiment the chiller also provides coolant to the radio-frequency transmitter. The chiller thermal model is also adapted for thermally modeling the radio-frequency transmitter. This is advantageous because the thermal load on the chiller due to the radio-frequency transmitter can also be modeled and predicted. This allows a more accurate determination of when the chiller should be switched on and off. This may provide for a more efficient means of reducing the peak electrical power consumption by the magnetic resonance imaging system.

In another embodiment the chiller is adapted for providing the coolant at least to the gradient coil power supply. The chiller thermal model is adapted for thermally modeling the gradient coil power supply. In this embodiment the chiller also is used to chill the gradient coil power supply. The chiller thermal model has been further adapted such that it is able to thermally model the thermal load caused by the gradient coil power supply. This is extremely advantageous because the thermal load on the chiller can be more accurately predicted and this may be used to better choose when the chiller should be switched on and off using the chiller control signals. This may provide for a proved means of reducing the peak electrical power consumption by the magnetic resonance imaging system.

In another embodiment execution of the machine executable instructions further cause the processor to receive a list of magnetic resonance imaging procedures each comprising a procedure pulse sequence. The pulse sequence is a procedure pulse sequence. Execution of the instructions further cause the processor to plan the order in which to perform the magnetic resonance imaging procedures to reduce the peak electrical power consumption by the magnetic resonance imaging system. This embodiment may be particularly advantageous because different pulse sequences may impose a different thermal load on the chiller and/or the cryo-cooler. The order in which the magnetic resonance imaging system may be performed may therefore we used to reduce the peak electrical power consumption. This may also be beneficial because the capacitor bank is typically charged in between magnetic resonance imaging uses also. Essentially a queue of pulse sequences allows the power management to be formed much more efficiently.

In another aspect the invention provides for a computer program product comprising machine executable instructions for execution by a processor. The computer program product may for instance be stored on a computer-readable storage medium. The processor is adapted for controlling a magnetic resonance imaging system comprising a set of magnetic field gradient coils. The magnetic resonance imaging system further comprises a gradient coil power supply for supplying the set of magnetic field gradient coils with electrical current. The magnetic resonance imaging system further comprises a chiller for chilling coolant in a coolant reservoir. The chiller is adapted for providing the coolant at least to the set of magnetic field gradient coils. The chiller is adapted for receiving chiller control signals from the processor. Execution of the instructions causes the processor to receive a pulse sequence. Further execution of the instructions cause the processor to generate the chiller control signals using the pulse sequence and a thermal model of the gradient coils and the coolant reservoir. The chiller control signals cause the chiller to halt chilling the coolant at least a portion of the time when the gradient coil power supply supplies current to the set of magnetic field gradient coils. Execution of the instructions further cause the processor to send the chiller control signals to the chiller. The advantages of this embodiment have been previously discussed.

In another aspect the invention provides for a method of controlling a magnetic resonance imaging system. Likewise the invention also provides for a computer-implemented method of controlling a magnetic resonance imaging system. The magnetic resonance imaging system comprises a set of magnetic field gradient coils. The magnetic resonance imaging system further comprises a gradient coil power supply for supplying the set of magnetic field gradient coils with electrical current. The magnetic resonance imaging system comprises a processor for controlling the magnetic resonance imaging system. The magnetic resonance imaging system comprises a chiller for chilling a coolant in a coolant reservoir. The chiller is adapted for providing the coolant at least to the set of magnetic field gradient coils. The chiller is adapted for receiving chiller control signals from the processor. The method comprises the step of receiving a pulse sequence. The method further comprises the step of generating the chiller control signals using the pulse sequence and a thermal model of the gradient coils and the coolant reservoir. The chiller control signals cause the chiller to halt chilling the coolant at least a portion of the time when the gradient coil power supply supplies current to the set of magnetic field gradient coils. The method further comprises the step of sending the chiller control signals to the chiller. The advantages of this embodiment have been previously discussed.

In another embodiment the chiller and/or cryo-cooler are smart systems which are adapted for controlling their own power consumption. A processor within the chiller and/or cryo-cooler generates the control signals. For instance, the chiller thermal model could be stored in a memory that is part of the chiller and a processor which is part of the chiller could generate the chiller control signals. Likewise, the cryogenic system thermal model could be stored in a memory that is part of the cryo-cooler and a processor which is part of the cryo-cooler could generate the cryo-cooler control signals control signals. This embodiment may be beneficial if the magnetic resonance imaging system is incorporated into a so called Smart Grid which self manages electrical power consumption.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
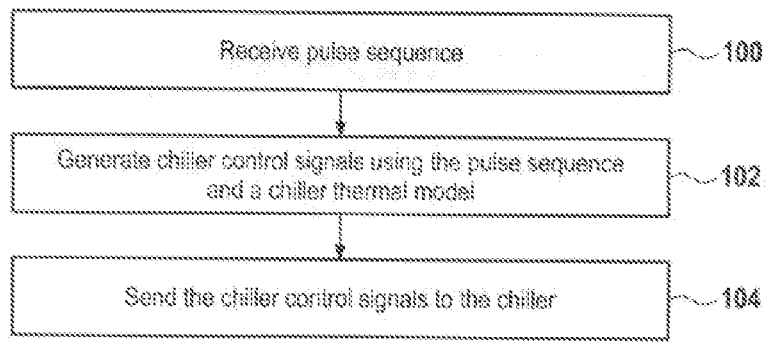
FIG. 1 shows a flow chart which illustrates a method according to an embodiment of the invention.

FIG. 1 shows a flow chart which illustrates a method according to an embodiment of the invention. First in step 100 a pulse sequence is received. Next in step 102 chiller control signals are generated using the pulse sequence and a chiller thermal model. For instance the pulse sequence could be parsed and using the thermal model a plan could be used to decide when the compressor of the chiller should be switched on or off. Finally, in step 104, the chiller control signals are sent to the chiller.

Figure 2:
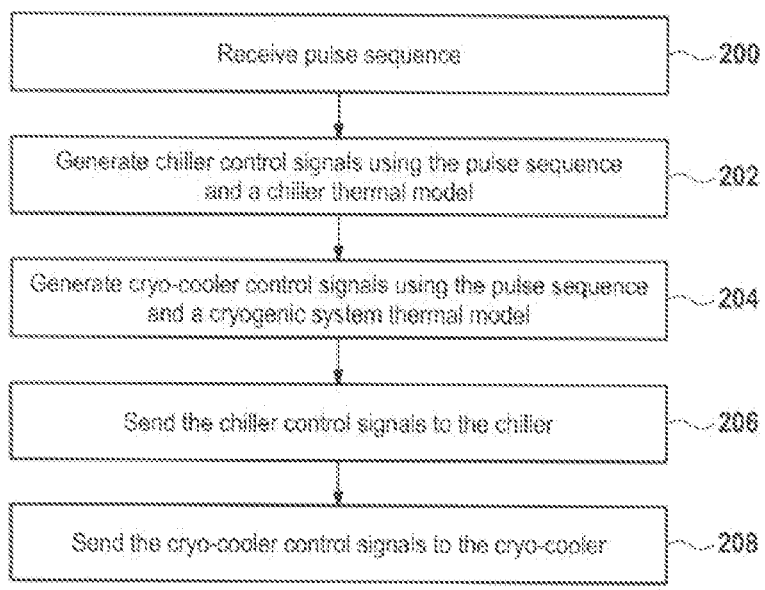
FIG. 2 shows a flow chart which illustrates a method according to a further embodiment of the invention.

FIG. 2 shows a flow chart which illustrates a method according to a further embodiment of the invention. In step 200 a pulse sequence is received. Next in step 202 chiller control signals are generated using the pulse sequence and a chiller thermal model. In step 204 cryo-cooler control signals are generated using the pulse sequence and a cryogenic system thermal model. Steps 202 and 204 may be performed in any order or may also be performed simultaneously. It may be beneficial to generate the chiller control signals and the cryo-cooler control signals at the same time. Doing them both at the same time would have the advantage of being able to plan when the chillers are operating and when the cryo-cooler is operating such that the peak electrical power consumption of the magnetic resonance imaging system is reduced. Next in step 206 the chiller control signals are sent to the chiller. Finally in step 208 the cryo-cooler control signals are sent to the cryo-cooler. Steps 206 and 208 may be performed in any order or may be performed simultaneously.

Figure 3:
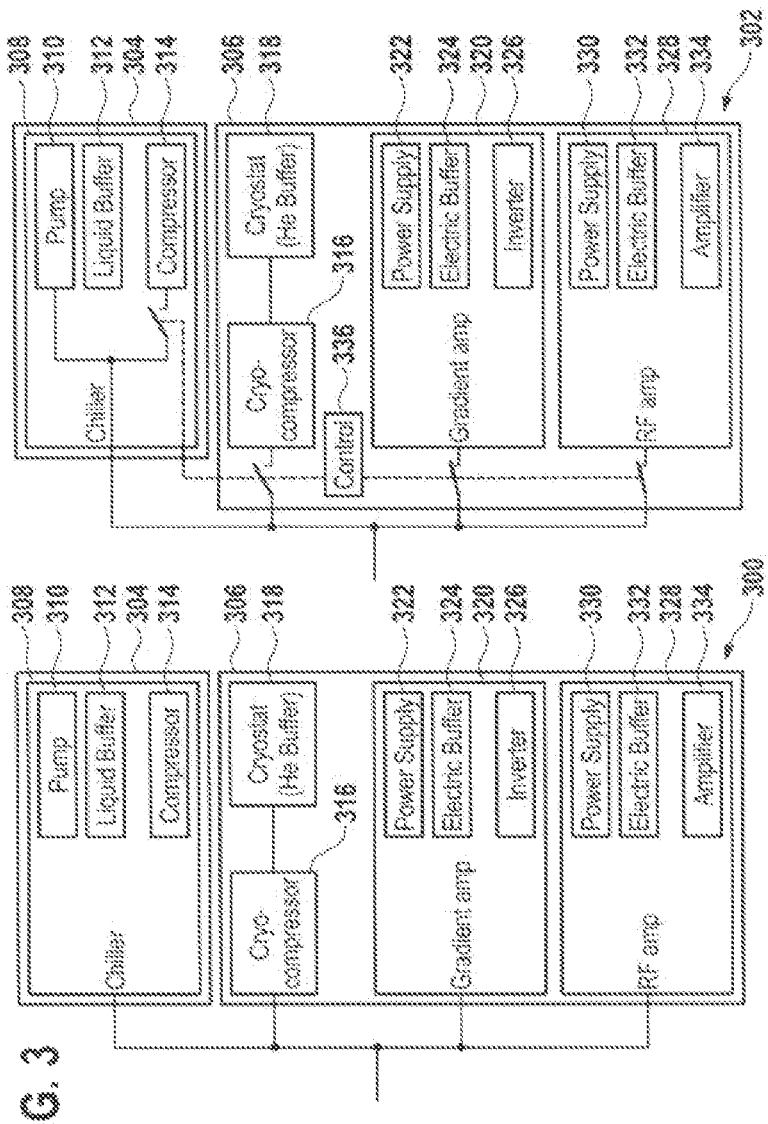
FIG. 3 illustrates various electrical components of a magnetic resonance imaging system and their electrical power consumption.

FIG. 3 shows various electrical components of a magnetic resonance imaging system and their electrical power consumption. There are two separate blocks shown. Group 300 shows the power consumption of the magnetic resonance imaging system without planning. Blocks 302 illustrate the power consumption when the planning of when to switch the chiller and/or cryo-compressor off is planned using the pulse sequence. This illustrates a benefit of the method according to the invention. Both blocks contain a chiller system 304 and a magnetic resonance imaging system 306. Examining the chiller system first 304 the chiller system 304 comprises a chiller 308. The chiller uses a predetermined amount of electrical power at peak. The chiller 308 comprises a pump 310, a liquid buffer 312, and a compressor 314. The liquid buffer 312 is equivalent to the coolant reservoir. The pump 310 allows the coolant to be pumped to other components for chilling them. The compressor 314 enables the chiller 308 to chill coolant within the liquid buffer 312.

Examining the magnetic resonance system in more detail, the magnetic resonance imaging system 306 comprises a cryo-compressor 316 which is in thermal contact with the cryostat 318 of the magnet. The cryo-compressor also uses a predetermined amount of electrical power at peak. The cryo-compressor is equivalent to the cryo-cooler. The magnetic resonance imaging system 306 further comprises a gradient amplifier 320. The gradient amplifier 320 is equivalent to the gradient coil power supply. The gradient amplifier 320 comprises a power supply 322, an electric buffer 324, and an inverter 326. The magnetic resonance imaging system 306 further comprises a radio-frequency amplifier 328. The radio-frequency amplifier 328 is equivalent to a radio-frequency transmitter. The radio-frequency amplifier 328 comprises a power supply 330, an electrical buffer 332, and an amplifier 334. For the power consumption without planning 300 the peak electrical power is the sum of the electrical power consumption of all components 308, 316, 320, 328.

Examining the blocks 302 for power consumption with planning there is an additional component; there is a controller 336 which is adapted for switching on and off the chiller 308, the cryo-compressor 316, the gradient amplifier 320, and the radio-frequency amplifier 328. In this example the compressor 314 and the cryo-compressor 316 are switched off. This has reduced the peak electrical power. Particularly in the developing world this reduction may be significant and makes it much easier to connect the magnetic resonance imaging system 306 and the chilling system 304 to the electrical grid. In the blocks 302 the electrical buffer 324 of the gradient amplifier 320 and the electrical buffer 332 of the radio-frequency amplifier 328 may be identical. This may enable a further reduction in the peak electrical power consumption.

Figure 4:
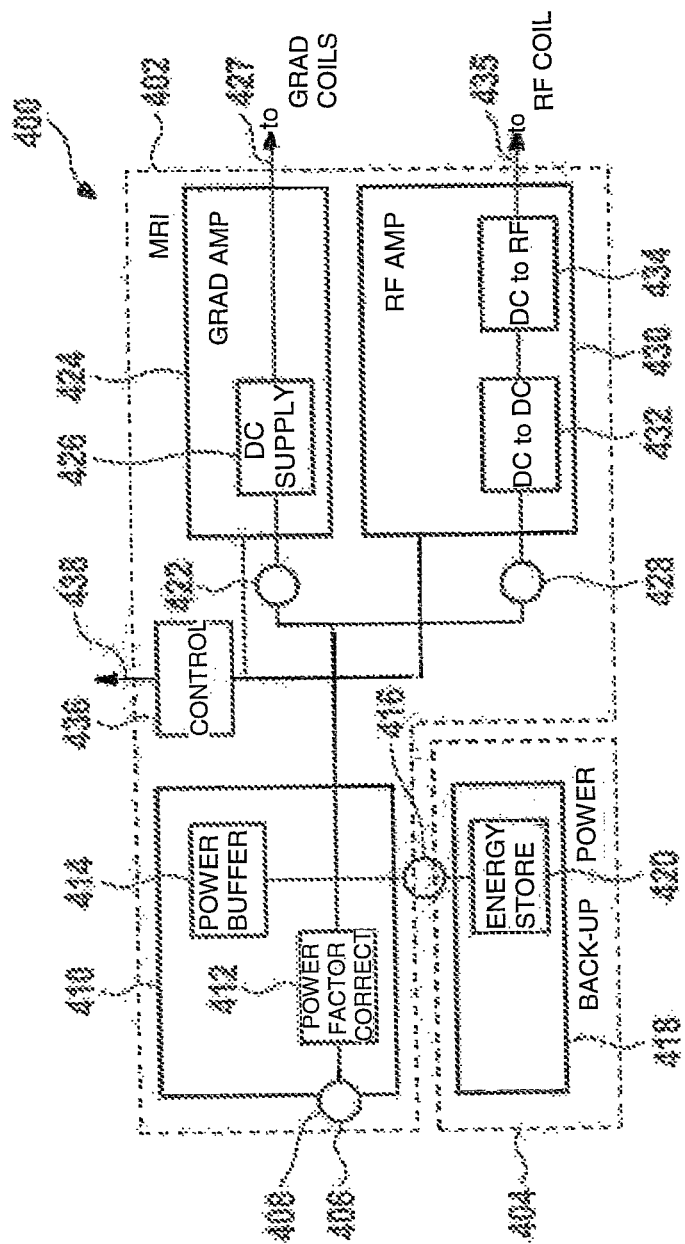
FIG. 4 illustrates an electrical system of a magnetic resonance imaging system according to an embodiment of the invention.

FIG. 4 illustrates an electrical system 400 of a magnetic resonance imaging system according to an embodiment of the invention. The electrical system 400 in this diagram is divided into two blocks. There are electrical components which belong to the magnetic resonance imaging system 402 and a second group of components which belong to a backup power system 404. There is a connection to the electrical grid 406. The electrical connection 406 is connected to a circuit breaker 408. The circuit breaker 408 is then connected to a power conditioner 410. The power conditioner 410 has several components. The power conditioner 410 comprises a power factor correction for AC-to-DC 412. This is essentially an AC-to-DC converter. The power conditioner 410 further comprises a large power buffer 414. The large buffer 414 is equivalent to the capacitor bank. The power factor correction 412 is connected to the large buffer 414. The power factor correction 412 is also connected to a circuit breaker 416.

The circuit breaker 416 is connected to the backup power system 404. The circuit breaker 416 is connected to an uninterrupted power supply 418 which comprises an energy storage device 420. The backup power system 404 is an optional embodiment. The power factor correction 412 is further connected to an over current protection 422. The power factor correction 412 supplies DC current to the over current protection 422. The over current protection 422 is connected to the gradient amplifier 424. The over current protection 422 is connected to a DC gradient supply 426 of the gradient amplifier 424. The DC gradient supply 426 is connected to a connection 427 for the set of gradient coils. The power factor correction 412 further supplies DC current to an over current protection 428. The over current protection 428 is connected to the RF amplifier 430. The over current protection 428 is connected to a DC-to-DC converter 432 of the radio-frequency amplifier 430. The DC-to-DC amplifier 432 is connected to a DC-to-radio-frequency converter 434. The DC-to-radio-frequency converter 434 is connected to a connection 435 to a radio-frequency coil. There is a control system 436 which is shown as being connected to the power conditioner 410, the gradient amplifier 424 and the radio-frequency amplifier 430. The controller 436 is also shown as having a connection 438 for controlling a chiller. The controller 436 is adapted such that it is able to perform embodiments in the invention and manage the peak electrical power requirements of the magnetic resonance imaging system.

Figure 5:
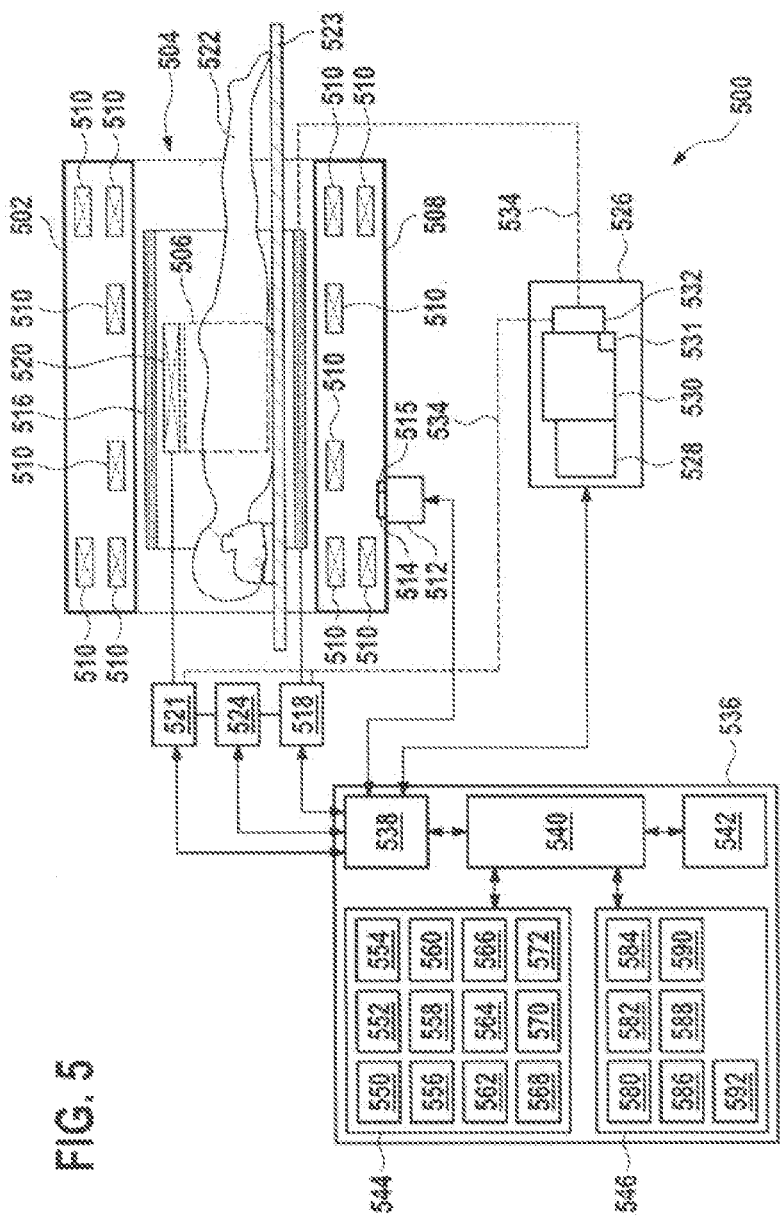
FIG. 5 illustrates a magnetic resonance imaging system according to an embodiment of the invention.

FIG. 5 shows an embodiment of a magnetic resonance imaging system 500 according to an embodiment of the invention. The magnetic resonance imaging system 500 comprises a magnet 502. The magnetic 502 has a bore 504. The magnet 502 shown is a cylindrical type superconducting magnet. The magnet has a liquid helium cooled cryostat 508 with superconducting coils 510. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Within the bore of the cylindrical magnet 502 there is an imaging zone 506 where the magnetic field is strong and uniform enough to perform magnetic resonance imaging.

There is a cryo-cooler 512 which has a cold head 514 in contact with the cryostat 508. The cryo-cooler 512 is for cooling the cryostat 508. On the cold heat 514 is a temperature sensor 515. The temperature sensor 515 is adapted for measuring the temperature of the cold head 514.

Also within the bore of the magnet 502 is a set of magnetic field gradient coils 516. The magnetic field gradient coils 516 are connected to a gradient coil power supply 518. Within the bore 504 of the magnet 502 there is also a set of magnetic field gradient coils 516 which is used during the acquisition of magnetic resonance data to spatially encode magnetic spins within an imaging zone 506 of the magnet 502. The magnetic field gradient coil 516 is connected to a gradient coil power supply 518. The set of magnetic field gradient coils 516 is intended to be representative. As was mentioned previously, magnetic field gradient coils typically contain three separate sets of coils for spatially encoding in three orthogonal spatial directions. A magnetic field gradient power supply 518 supplies current to the magnetic field gradient coils 516. The current supplied to the magnetic field coils is controlled as a function of time and may be ramped or pulsed.

Adjacent to the imaging zone 506 is a radio-frequency coil 520 for manipulating the orientations of magnetic spins within the imaging zone 506 and for receiving radio transmissions from spins also within the imaging zone 506. The radio-frequency coil 520 is connected to a radio-frequency transceiver 521. The radio-frequency coil may contain multiple coil elements. The radio-frequency coil 520 may also be referred to as a channel or as an antenna. The radio-frequency coil 520 is connected to a radio frequency transceiver 521. The radio-frequency coil 520 and radio frequency transceiver 521 may be replaced by separate transmit and receive coils and a separate radio-frequency transmitter and radio-frequency receiver. It is understood that the radio-frequency coil 520 and the radio frequency transceiver 521 are representative. The radio-frequency coil 520 is intended to also represent a dedicated transmit antenna and a dedicated receive antenna. Likewise the transceiver 521 may also represent a separate radio-frequency transmitter and a radio frequency receiver.

A subject 522 is located with the bore of the magnet 502 and is seen as reposing on a subject matter 523. A portion of the subject 522 is within the imaging zone 506. There is a capacitor bank 524 which is connected to the radio-frequency transceiver 521 and the gradient coil power supply 518. The capacitor bank 524 is adapted for supplying DC electrical current to both the radio-frequency transceiver 521 and the gradient coil power supply 518. In this Fig. the connections to the electrical grid and the power distribution are not illustrated. The illustrations of the power distribution are shown in FIG. 4.

The magnetic resonance imaging system 500 is shown as further comprising a chiller 526. The chiller 526 comprises a compressor 528 for chilling coolant in a coolant reservoir 530. The coolant reservoir 530 is shown as containing a temperature sensor 531 adapted for measuring the temperature of coolant within the coolant reservoir 530. The chiller 526 further comprises a pump 532 adapted for pumping coolant within the coolant reservoir 530 for cooling external devices. The pump 532 is connected to several coolant tubes 534. The coolant tubes 534 are adapted for delivering and returning coolant to the magnetic field gradient coils 516, the gradient coil power supply 518 and the radio-frequency transceiver 512. The chiller 526 may not supply coolant to all of these components in all embodiments. As was mentioned previously, the coolant may indirectly cool the gradient coils. For instance the coolant may be used to cool a secondary circuit which is operated at a higher temperature to prevent condensation on or around the gradient coils. This detail is not shown in this figure.

The cryo-cooler 512, the gradient coil power supply 518, the radio-frequency transceiver 521, the capacitor bank 524, and the chiller 526 are all shown as being connected to a hardware interface 538 of the computer system 536. The hardware interface 538 is further connected to a processor 540 of the computer system 536. The hardware interface 538 allows the processor 540 to send and receive control signals for controlling the operation and function of the magnetic resonance imaging system 500. The processor 540 is shown as further being connected to a user interface 542, computer storage 544, and computer memory 546.

The computer storage 544 is shown as containing a pulse sequence 550. The computer storage 544 is further shown as containing chiller control signals and reservoir temperature measurements 544. The reservoir temperature measurements 544 were acquired using the temperature sensor 531. The computer storage 544 is further shown as containing modified chiller control signals 556. The computer storage is further shown as containing cryo-cooler control signals 558. The computer storage 544 is further shown as containing cold head temperature measurements 560 that were acquired using the temperature sensor 515. Computer storage 544 is further shown as containing modified cryo-cooler control signals 562. Computer storage 544 is further shown as containing charging commands 564. The charging commands 564 are commands for controlling the charging of the capacitor bank 524. The computer storage 544 is further shown as containing a list of magnetic resonance procedures. The computer storage 544 is further shown as containing a set of procedure pulse sequences. The set of procedure pulse sequences 568 are pulse sequences with one corresponding to each of the magnetic resonance procedures in the list of magnetic resonance procedures 566. The computer storage 544 is further shown as containing magnetic resonance data 570 acquired using the magnetic resonance imaging system 500. The computer storage 544 is further shown as containing a magnetic resonance image 572 which is then reconstructed from the magnetic resonance data 570.

The computer memory 546 is shown as containing a control module 580. The control module contains computer executable code for controlling the operation and function of the magnetic resonance imaging system 500. For instance the control module may contain computer executable code which helps the processor to parse the pulse sequence 550 and generate commands for controlling the magnetic resonance imaging system 500. The computer memory 546 is further shown as containing a chiller thermal model 582.

The chiller thermal model 582 contains computer executable code which allows the thermal modeling of the chiller 526 and any components chilled by the chiller. The chiller thermal model 582 may be something such as a complicated finite element or finite difference model or it may be a simple lumped elements thermal model.

The computer memory 546 is further shown as containing a chiller control signal generation module 584. The chiller control signal generation module 584 contains computer executable code for generating the chiller control signals 552 and the modified chiller control signals 556. The chiller control signal generation module 584 may use the chiller thermal model 582, the pulse sequence 550, and/or the reservoir temperature measurements 554 to generate the chiller control signals 552 and the modified chiller control signals 556. The computer memory 546 is further shown as containing a cryogenic system thermal model 586. The cryogenic system thermal model 586 contains computer executable code which allows the thermal modeling of the cryogenic system which includes the cryostat 508, the cryo-cooler 512 and the cold head 514. The computer memory 546 is further shown as containing a cryo-cooler control signal generation module 588. The cryo-cooler control signal generation module 588 contains computer executable code for generating the cryo-cooler control signals 558 and the modified cryo-cooler control signals 562. The cryo-cooler control signal generation module 588 may use the sequence 550, the cryogenic system thermal model 586 and/or the cold head temperature measurement 560 to generate the cryo-cooler control signals 558 and the modified cryo-cooler control signals 562.

The computer memory 564 is further shown as containing an image reconstruction module 590. The image reconstruction module 590 contains computer executable code for constructing the magnetic resonance image 572 from the magnetic resonance data 570. The computer memory 564 is further shown as containing a procedure planning module 592. The procedure planning module 592 contains computer executable code which allows the magnetic resonance imaging system 500 to choose the order in which the magnetic resonance procedures listed in the list of magnetic resonance procedures 566 is performed. The procedure planning module 592 may use the set of procedure pulse sequences 568, the chiller control signal generation module 584, and the cryo-cooler control signal generation module 588 to generate a choice as to which of the magnetic resonance procedures is performed.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 300 power consumption without planning
302 power consumption with planning
304 chiller system
306 magnetic resonance imaging system
308 chiller
310 pump
312 liquid buffer
314 compressor
316 cryo-compressor
318 cryostat
320 gradient amplifier
322 power supply
324 electrical buffer
326 inverter
328 radio-frequency amplifier
330 power supply
332 electrical buffer
334 amplifier
400 electrical system
402 magnetic resonance imaging system
404 backup power
406 connection to electrical grid
408 circuit breaker
410 power conditioner
412 power factor correction AC/DC
414 large buffer
416 circuit breaker
418 uninterrupted power supply
420 energy storage
422 over current protection
424 gradient amplifier
426 DC gradient supply
427 connection to set of gradient coils
428 over current protection
430 radio-frequency amplifier
432 DC to DC converter
434 DC to radio-frequency converter
435 connection to radio frequency coil
436 control system
438 connection to chiller
500 magnetic resonance imaging system
502 magnet
504 bore of magnet
506 imaging zone
508 cryostat
510 superconducting coil
512 cryo-cooler
514 cold head
515 temperature sensor
516 magnetic field gradient coils
518 gradient coil power supply
520 radio-frequency coil
521 radio-frequency transceiver
522 subject
523 subject support
524 capacitor bank
526 chiller
528 compressor
530 coolant reservoir
531 temperature sensor
532 pump 534 coolant tubes
536 computer system
538 hardware interface
540 processor
542 user interface
544 storage
546 memory
550 pulse sequence
552 chiller control signals
554 reservoir temperature measurements
556 modified chiller control signals
558 cryo-cooler control signals
560 cold head temperature measurements
562 modified cryo-cooler control signals
564 charging commands
566 list of magnetic resonance procedures
568 set of procedure pulse sequences
570 magnetic resonance data
572 magnetic resonance image
580 control module
582 chiller thermal model
584 chiller control signal generation module
586 cryogenic system thermal model
588 cryo-cooler control signal generation module
590 image reconstruction module
592 procedure planning module

The invention claimed is:

1. A magnetic resonance imaging system comprising:
a set of magnetic field gradient coils;
a gradient coil power supply for supplying the set of magnetic field gradient coils with electrical current;
a chiller having the function to chill coolant in a coolant reservoir
a processor having the function to control the chiller;
wherein the chiller is adapted for providing the coolant at least to the set of magnetic field gradient coils, wherein the chiller is adapted for receiving chiller control signals from the processor and the chiller is controlled by way of the chiller control signals;
a memory for storing machine executable instructions, wherein execution of the instructions causes the processor to:
receive a pulse sequence;
generate the chiller control signals using the pulse sequence and a chiller thermal model of the gradient coils and the coolant reservoir, wherein the processor derives from the pulse sequence which gradient pulses are included in the pulse sequence and employs the thermal model to estimate the temperature of the magnetic field gradient coils during operation of the pulse sequence, the processor derives on the basis of the estimated temperature the chiller control signals so as to reduce the temperature of the magnetic field gradient coils before the pulse sequence is applied, wherein the chiller control signals cause the chiller to halt chilling the coolant independently of the temperature of the gradient coils and for at least a portion of the time when the gradient coil power supply supplies current to the set of magnetic field gradient coils wherein the coolant reservoir provides for a thermal reservoir which is used to chill the set of magnetic field gradients coils when the chilling of the coolant is halted, and wherein the chiller control signals are adapted to reduce the peak electrical power consumption by the magnetic resonance imaging system; and
send the chiller control signals to the chiller.

2. The magnetic resonance imaging system of claim 1, wherein the magnetic resonance imaging system further comprises a thermal reservoir temperature monitor, wherein execution of the further instructions causes the processor to:
monitor the reservoir temperature using the reservoir temperature monitor,
modify the chiller control signals in response to the reservoir temperature being above a predetermined threshold, and
send the modified chiller control signals to the chiller.

3. The magnetic resonance imaging system of claim 1, wherein the magnetic resonance imaging system further comprises a radio-frequency transmitter, wherein the radio-frequency transmitter is adapted for being powered by direct current electrical power, wherein the magnetic resonance imaging system further comprises capacitor bank for providing direct current electrical power to both the radio-frequency transmitter and the gradient coil power supply.

4. The magnetic resonance imaging system of claim 3, wherein the radio-frequency transmitter is adapted for being powered by a variable voltage direct current electrical power source, wherein the capacitor bank is adapted for providing variable voltage direct current electrical power to both the gradient coil power supply and the radio-frequency transmitter.

5. The magnetic resonance imaging system of claim 3, wherein the capacitor bank comprises at least a first capacitor bank and a second capacitor bank, wherein the capacitor bank is adapted for supplying direct current electrical power to the radio-frequency transmitter using one of the first capacitor bank and the second capacitor bank, wherein the capacitor bank is adapted for supplying direct current electrical power to the gradient coil power supply using both the first capacitor bank and the second capacitor bank.

6. The magnetic resonance imaging system of claim 3, wherein the capacitor bank is adapted for receiving charging commands from the processor, wherein execution of the instructions causes the processor to:
generate charging commands using the pulse sequence, wherein the charging commands are adapted to reduce the peak electrical power consumption of the magnetic resonance imaging system,
send the charging commands to the capacitor bank.

7. The magnetic resonance imaging system of claim 3, wherein the chiller is adapted for providing the coolant at least to the radio-frequency transmitter, and wherein the chiller thermal model is adapted for thermally modeling the radio-frequency transmitter.

8. The magnetic resonance imaging system of claim 1, wherein the chiller is adapted for providing the coolant at least to the gradient coil power supply, and wherein the chiller thermal model is adapted for thermally modeling the gradient coil power supply.

9. The magnetic resonance imaging system of claim 1, wherein execution of the instructions further causes the processor to:
receive a list of magnetic resonance imaging procedures each comprising a procedure pulse sequence, wherein the pulse sequence is a procedure pulse sequence; and
plan an order in which to perform the magnetic resonance imaging procedures to reduce the peak electrical power consumption by the magnetic resonance imaging system.

10. A magnetic resonance imaging system comprising:
a set of magnetic field gradient coils;
a gradient coil power supply configured to supply the set of magnetic field gradient coils with electrical current;

a chiller configured to chill coolant in a coolant reservoir, wherein the chiller is configured to provide coolant at least to the set of magnetic field gradient coils;

a cryogenically cooled magnet;

a cryo-cooler configured to cool the cryogenically cooled magnet, wherein the cryo-cooler comprises a cryo-compressor;

a memory for storing machine executable instructions;

a processor configured to execute the machine executable instructions to:

receive a pulse sequence;

generate chiller control signals using the pulse sequence and a chiller thermal model of the gradient coils and the coolant reservoir, wherein the chiller control signals cause the chiller to halt chilling the coolant independently of the temperature of the gradient coils and for at least a portion of the time when the gradient coil power supply supplies current to the set of magnetic field gradient coils;

generate the cryo-cooler control signals using the pulse sequence and a cryogenic system thermal model for thermally modeling the cryo-cooler and the cryogenically cooled magnet, wherein the cryo-cooler control signals are configured to cause the cryo-compressor to halt at least a portion of the time when the gradient coil power supply supplies current to the set of magnetic field gradient coils;

send the chiller control signals to the chiller; and send the cryo-cooler control signals to the cryo-cooler.

11. The magnetic resonance imaging system of claim 10, wherein the cryo-control signals are configured to reduce the peak electrical power consumption by the magnetic resonance imaging system.

12. The magnetic resonance imaging system of claim 10, wherein the cryo-cooler comprises a cold head for configured to provide heat transfer between the cryogenically cooled magnet and the cryo-cooler, wherein the magnetic resonance imaging system further comprises a cold head temperature monitor, wherein execution of the instructions causes the processor to:

monitor the cold head temperature using the cold head temperature monitor, modify the cryo-cooler control signals in response to the cold head temperature being above a predetermined threshold, and send the modified cryo-cooler control signals to the cryo-cooler.

13. The magnetic resonance imaging system of claim 10, wherein the chiller control signals are adapted to reduce the peak electrical power consumption by the magnetic resonance imaging system.

14. A method of controlling a magnetic resonance imaging system, wherein the magnetic resonance imaging system comprises a set of magnetic field gradient coils, a gradient coil power supply configured to supply the set of magnetic field gradient coils with electrical current, a chiller configured to chill coolant in a coolant reservoir, and provide the coolant at least to the set of magnetic field gradient coils, wherein the method comprises with one or more processors:

receiving a pulse sequence, the pulse sequence including gradient pulses;

estimating a temperature of the magnetic field gradient coils during application of the pulse sequence using the pulse sequence and a chiller thermal model of the gradient coils and the coolant reservoir;

generating chiller control signals based on the estimated temperature and wherein the chiller control signals cause the chiller to halt chilling the coolant independently of the temperature of the gradient coils and when the gradient coil power supply supplies current to the set of magnetic field gradient coils, wherein the coolant reservoir is used to chill the set of magnetic field gradient coils when the chilling of the coolant is halted, and wherein the chiller control signals are configured to reduce the peak electrical power consumption by the magnetic resonance imaging system; and sending the chiller control signals to the chiller.

15. A non-transitory computer-readable medium carrying machine executable instructions for controlling a processor to perform the method according to claim 14.

* * * * *